United States Patent [19]

Wood

[11] Patent Number: 5,171,981
[45] Date of Patent: Dec. 15, 1992

[54] FIBER-OPTIC VOLTAGE SENSOR WITH CLADDED FIBER AND EVANESCENT WAVE VARIATION DETECTION

[75] Inventor: Charles B. Wood, Lakewood, Colo.

[73] Assignee: The United States of America as represented by United States Department of Energy, Washington, D.C.

[21] Appl. No.: 551,834

[22] Filed: Jul. 12, 1990

[51] Int. Cl.[5] ............................................. H01J 5/16
[52] U.S. Cl. ................................. 250/227.14; 324/96
[58] Field of Search ..................... 324/96; 250/231.11, 250/227.14, 227.19

[56] References Cited

U.S. PATENT DOCUMENTS

| | | | |
|---|---|---|---|
| 4,376,248 | 3/1983 | Giallorenzi et al. | 324/96 |
| 4,516,021 | 5/1985 | Taylor | 250/227 |
| 4,524,322 | 6/1985 | Bobb | 324/96 |
| 4,547,729 | 10/1985 | Adolfsson et al. | 324/96 |
| 4,603,296 | 7/1986 | Koo et al. | 324/244 |
| 4,622,460 | 11/1986 | Failes et al. | 250/227 |

OTHER PUBLICATIONS

M. Corke et al., "All Single Mode Fiber Magnetic Field Sensor", SPIE, vol. 566, Fiber Optic and Laser Sensors III, 1985, pp. 294-299.

S. Watanabe et al., "An Overview of Mach-Zehnder Interferometric Sensors", SPIE, vol. 566, Fiber Optic and Laser Sensors III, 1985, pp. 16-21.

Primary Examiner—David C. Nelms
Assistant Examiner—T. Davenport
Attorney, Agent, or Firm—Karla Ojanen; James H. Chafin; William R. Moser

[57] ABSTRACT

A fiber optic voltage sensor is described which includes a source of light, a reference fiber for receiving a known percentage of the light and an electrostrictive element having terminals across which is applied, a voltage to be measured. The electrostrictive element is responsive to the applied voltage to assume an altered physical state. A measuring fiber also receives a known percentage of light from the light source and is secured about the electrostrictive element. The measuring fiber is provided with a cladding and exhibits an evanescent wave in the cladding. The measuring fiber has a known length which is altered when the electrostrictive element assumes its altered physical state. A differential sensor is provided which senses the intensity of light in both the reference fiber and the measuring fiber and provides an output indicative of the difference between the intensities.

5 Claims, 2 Drawing Sheets

5,171,981

FIBER-OPTIC VOLTAGE SENSOR WITH CLADDED FIBER AND EVANESCENT WAVE VARIATION DETECTION

"The United States Government has rights in this invention pursuant to Contract No. DE-AC04-76DPO3533 between the United States Department of Energy and EG&G Rocky Flats, Inc., (formerly Rockwell International)"

FIELD OF THE INVENTION

This invention relates to fiber-optic devices, and more particularly, to a fiber-optic device particularly adapted to sensing and measuring high voltages.

BACKGROUND OF THE INVENTION

The application of fiber-optic devices to various measuring circuits is known in the prior art. For instance fiber-optics have been extensively employed in Mach-Zehnder interferometers. In such devices one optical fiber is used as a standard and another is associated with an apparatus that experiences a physical dimension change in response to a phenomenon. That change induces a length change in the optical fiber which, in turn, causes a phase change in light in the fiber. When the altered phase is compared against the phase in the standard fiber, a measurement of the phenomenon which caused the physical change is obtained. Such interferometers are described in an article entitled "An Overview of Mach-Zehnder Interferometric Sensors", Watanabe et al., SPIE, Vol. 566, Fiber Optic and Laser Sensors, III, 1985, pp. 16–21.

A fiber-optic sensor for detecting magnetic fields is described in an article entitled "All Single Mode Fiber Magnetic Field Sensor", Cork et al., SPIE, Vol. 566, Fiber Optic and Laser Sensors, III, pp. 294–299. In that sensor, the fiber which serves as the phase standard is coiled around a piezo-electric cylinder that is in turn, employed as an active phase compensator to maintain the interferometer at its point of maximum sensitivity. The sensing fiber leg is juxtaposed to a Metglass sensing element which induces phase changes in the associated fiber. In such interferometric sensors, the circuitry required to detect and analyze the phase changes of the transmitted light beams are both expensive and complex.

A variety of fiber optic sensors have been applied to the sensing and measurement of various types of magnetic fields. For instance, in U.S. Pat. No. 4,516,021 to Taylor a birefringent optical fiber is employed in combination with a magnetostrictive block that induces strains in the fiber in response to an applied magnetic field. Any change in birefringence in the fiber is measured by directing the light exiting the fiber through a polarizer or prism and then detecting the change in intensity modulation in a photodetector.

In U.S. Pat. No. 4,603,296 to Koo et al. a magnetometer is described that uses interferometric principles to detect changes in a magnetic field. The fiber used as the sensor is associated with a magnetostrictive jacket, and thus has its length altered by alterations of the jacket in a magnetic field. A phase detector produces signals proportional to the resulting phase shift.

In U.S. Pat. No. 4,622,460 to Failes et al. a further fiber-optic magnetic sensor is disclosed which, as above, causes changes in the length of the fiber as a result of deformations of magnetic sensors. In each of the above cases, the fiber optic system is used to measure changes in a magnetic field, which changes induce strains in a measuring optical fiber to thereby enable measurements of the altered magnetic field.

Optical fibers have also been employed to measure current and/or voltage. In U.S. Pat. No. 4,547,729 to Adolfsson et al., an optical fiber system is employed to measure the voltage applied to a piezo-electric transducer. In specific, a mirror is connected to the piezo-electric transducer and, dependent upon the amount of voltage applied thereto, deflects the mirror and reflects either more or less light back onto a receiving fiber sensor. Thus, the system employs alterations in reflected light to achieve its measurements, notwithstanding the use of optical fibers.

In certain industrial environments, high voltages are present which must be accurately measured in order to assure proper operation of devices dependent thereupon. For instance, electron beam welding requires precise measurement of high voltages to produce acceptable welds. Unfortunately, in the environment of electron beam welders, extremely high fields are present which make impractical normal conductive type measuring circuits and devices. Similar environments exist in radar, sonar, and pulsed high voltage applications.

Accordingly, it is an object of this invention to provide an optical sensor particularly adapted to working in high field environments.

It is a further object of this invention to provide an optical sensor particularly adapted to measuring voltages in high noise/field environments while additionally providing for personnel safety via isolation of the management instruments.

SUMMARY OF THE INVENTION

A fiber optic voltage sensor is described which includes a source of light, a reference fiber for receiving a known percentage of the light and an electrostrictive element having terminals across which is applied, a voltage to be measured. The electrostrictive element is responsive to the applied voltage to assume an altered physical state. A measuring fiber also receives a known percentage of light from the light source and is secured about the electrostrictive element. The measuring fiber is provided with a cladding and exhibits an evanescent wave in the cladding. The measuring fiber has a known length which is altered when the electrostrictive element assumes its altered physical state. A differential sensor is provided which senses the intensity of light in both the reference fiber and the measuring fiber and provides an output indicative of the difference between the intensities.

DETAILED DESCRIPTION OF THE INVENTION

Figure 2:
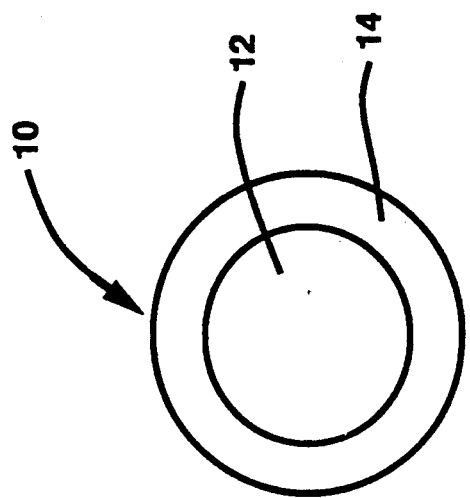
FIG. 2 is an end view of the fiber of FIG. 1.
Figure 1:
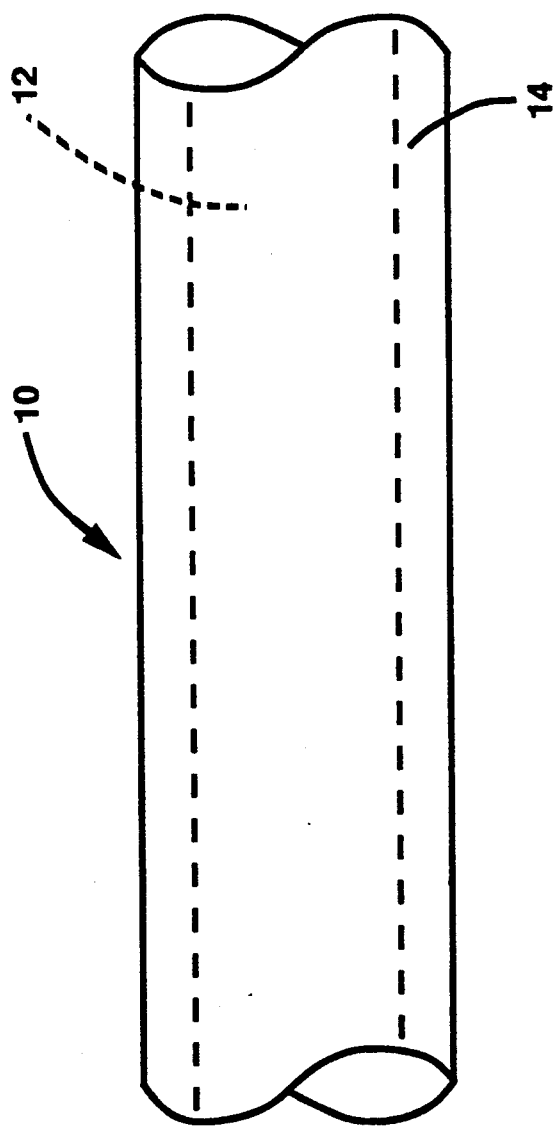
FIG. 1 is a side view of an optical fiber having a cladding thereabout.

Referring now to FIGS. 1 and 2, an optical fiber (10) is comprised of a core (12) that is surrounded by a cladding (14). The refractive index of cladding material (14) is selected so as to insure as complete a total internal reflection as possible, for light induced into fiber core (12). Notwithstanding the total internal reflection, theories which describe the action of lightwaves within optical fiber (10) predict an electromagnetic field in fiber cladding (14). Thus, even though there is no power transfer into the cladding, a field exists therein and may be represented by an exponentially decaying function that propagates parallel to the core-cladding boundary. That field is called an evanescent wave. It is also known that the evanescent wave or field forms a significant element of the loss factor in an optical fiber. Thus, as the length of an optical fiber is either increased or decreased, the amount of light intensity dissipated by the evanescent field will vary accordingly. It is this variation which is employed as the central measuring phenomenon in the invention.

Figure 3:
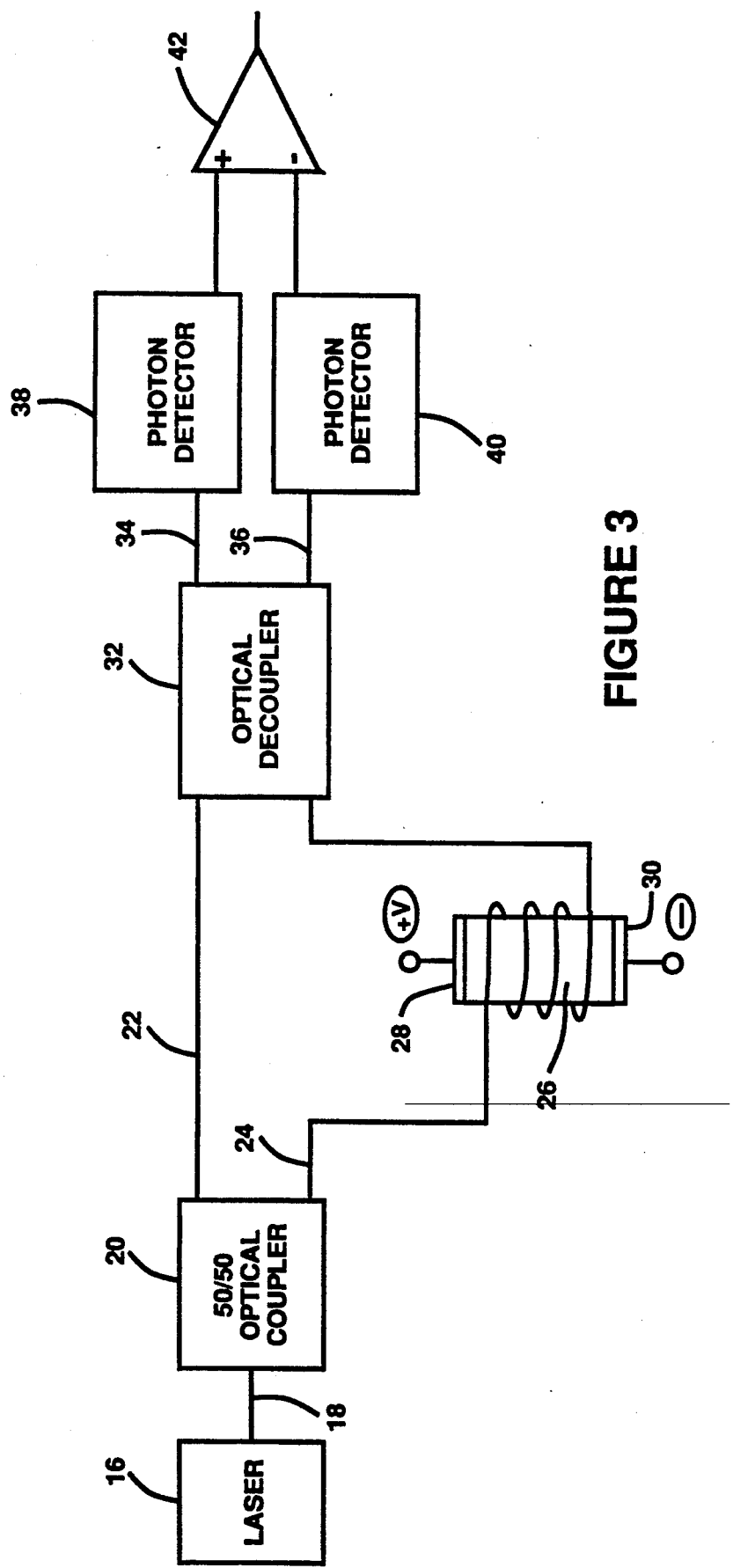
FIG. 3 is a block diagram which illustrates the invention.

Referring now to FIG. 3, a laser (16) has its output applied via fiber (18) to a 50/50 optical coupler (20). 50% of the input light from laser (16) is impressed on optical fiber (22) and another 50% is injected into fiber (24). Fiber (24) is a clad fiber, such as shown in FIGS. 1 and 2. Fiber (24) is wrapped about an electrostrictive element (26) which, in turn, is provided with opposed conductive plates (28) and (30) across which a voltage to be measured can be applied. Electrostrictive element (26) is preferably a crystalline material that exhibits piezo-electric or other electrostrictive effects in response to an applied voltage. As is well known, the application of a voltage between plates (28) and (30) causes a physical deformation of electrostrictive element (26). By wrapping fiber (24) tightly about element (26), its deformation is caused to alter the length of fiber (24) and thereby modify the loss seen by light travelling therethrough.

After leaving electrostrictive element (26), optical fiber (24) is applied to an optical decoupler (32), as is optical fiber (22). The function of optical decoupler (32) is to prevent light reflections from being induced by "downstream" measuring apparatus back into the optical measuring circuit.

Outputs corresponding to the light level fibers (22) and (24) are respectively applied to fibers (34) and (36) which are, in turn, connected to photon converters (38) and (40). Therein, the light levels are converted to electrical signals which are then applied to a differential amplifier (42) whose output, in the well-known manner, is proportional to the difference therebetween.

From the above, it can be seen that the application of a high voltage across electrostrictive element (26) causes an alteration in the length of fiber (24) which alteration modifies the intensity of the light passing therethrough. This intensity change is detected and a proportional voltage produced by differential amplifier (42).

It should be understood that while it is contemplated that the light levels initially induced on optical fibers (22) and (24) are equal, this does not have to be so and different percentages can be induced therein. In such case, the output from differential amplifier (42) must be calibrated accordingly.

Electrostrictive device (26) and its associated optical fiber winding can be placed in an area of high voltage and high field, while the remaining portions of the optical circuit can be either isolated therefrom. It is only necessary that the laser, photon detectors and differential amplifier be isolated from the high field environment to enable accurate voltage measurements to be taken.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. A fiber optic voltage sensor comprising:
   (a) a source of light;
   (b) a reference fiber for receiving a known percentage of said light;
   (c) an electrostrictive element having terminals to which a voltage to be measured can be applied, said electrostrictive element responsive to said applied voltage to assume an altered physical state;
   (d) a clad measuring fiber for receiving a known percentage of said light, said fiber having an evanescent wave, said measuring fiber secured about said electrostrictive element, and having a known length which is altered when said electrostrictive element assumes an altered physical state; and
   (e) differential sensing means for sensing the intensity of light in both said reference fiber and said measuring fiber and providing an output indicative of the difference thereof, said light intensity in said measuring fiber being altered by a corresponding variation of said evanescent wave resulting from an alteration in the length of said measuring fiber.

2. The fiber optic voltage sensor defined in claim wherein said electrostrictive element is a piezo-electric device.

3. The fiber optic voltage sensor as defined in claim 2 wherein said differential sensing means further comprises:
   a first photon detector for detecting the light intensity in said reference fiber;
   a second photon detector for detecting the light intensity in said measuring fiber; and
   differential amplifier means connected to said first and second photon detectors for providing a signal indicative of the difference in outputs therebetween.

4. The fiber optic voltage sensor as defined in claim 3 further comprising:
   optical decoupler means connected between said first and second photon detectors and said reference and measuring fibers, said optical decoupler preventing light reflection back into said fibers from said detectors.

5. The fiber optic voltage sensor as defined in claim 4 further comprising:
   optical coupling means connected between said source of light and said reference and measuring fibers for dividing light from said source of light on a 50/50 basis to said fibers.

* * * * *